(12) United States Patent
Fujii et al.

(10) Patent No.: US 8,153,941 B2
(45) Date of Patent: Apr. 10, 2012

(54) METHOD OF HEATING SUPERPOSED COMPONENTS AND HEATING APPARATUS THEREFOR

(75) Inventors: Masanao Fujii, Kawasaki (JP); Toru Okada, Kawasaki (JP); Hidehiko Kobayashi, Kawasaki (JP); Seiichi Shimoura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1770 days.

(21) Appl. No.: 10/199,850

(22) Filed: Jul. 19, 2002

(65) Prior Publication Data
US 2003/0173411 A1 Sep. 18, 2003

(30) Foreign Application Priority Data
Mar. 18, 2002 (JP) ................................. 2002-074638

(51) Int. Cl.
*H05B 3/10* (2006.01)
*H05B 3/02* (2006.01)
(52) U.S. Cl. ........................................ 219/548; 219/546
(58) Field of Classification Search .................. 219/548, 219/546
See application file for complete search history.

(56) References Cited

U.S. PATENT DOCUMENTS

| 4,399,347 | A | * | 8/1983 | Schmitt .......................... 219/203 |
| 4,860,434 | A | * | 8/1989 | Louison et al. ................. 29/611 |
| 5,498,306 | A | | 3/1996 | Shibata et al. |
| 5,643,802 | A | | 7/1997 | Yamashita |
| 5,644,895 | A | * | 7/1997 | Edwards et al. ................... 53/55 |
| 6,433,317 | B1 | * | 8/2002 | Arx et al. ..................... 219/468.1 |
| 6,683,283 | B2 | * | 1/2004 | Schmidt ......................... 219/424 |
| 6,897,415 | B2 | * | 5/2005 | Fujiwara et al. ............ 219/444.1 |

FOREIGN PATENT DOCUMENTS

| JP | 4316855 | 11/1992 |
| JP | 5055406 | 3/1993 |
| JP | 8274130 | 10/1996 |
| JP | 8293530 | 11/1996 |
| JP | 8316253 | 11/1996 |
| JP | 9-181342 | 7/1997 |
| JP | 11317469 | 11/1999 |
| JP | 2000-151102 | 5/2000 |
| JP | 2001-171122 | 6/2001 |

* cited by examiner

*Primary Examiner* — Daniel L Robinson
(74) *Attorney, Agent, or Firm* — Greer, Burns & Crain, Ltd.

(57) ABSTRACT

A first plate material is set on a work stage. The first plate material includes first components commonly connected to a first connection member. A second plate material is subsequently set on the work stage. The second plate material includes second components commonly connected to a second connection member. The second components are superposed on the corresponding first components. The first components as well as the second components can be handled as a one-piece component. It leads to an improved productivity. Heat surfaces of a heat block contact the second components. The connection members are prevented from thermal expansion. The constant intervals are reliably maintained between the adjacent first components and the adjacent second components.

14 Claims, 16 Drawing Sheets

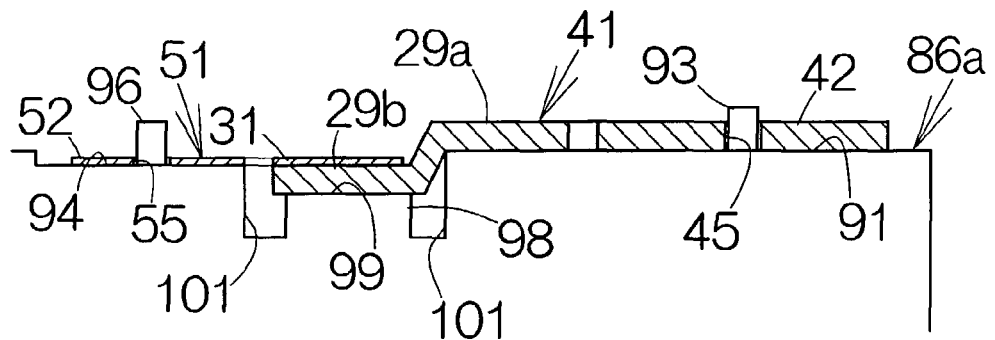
FIG.14
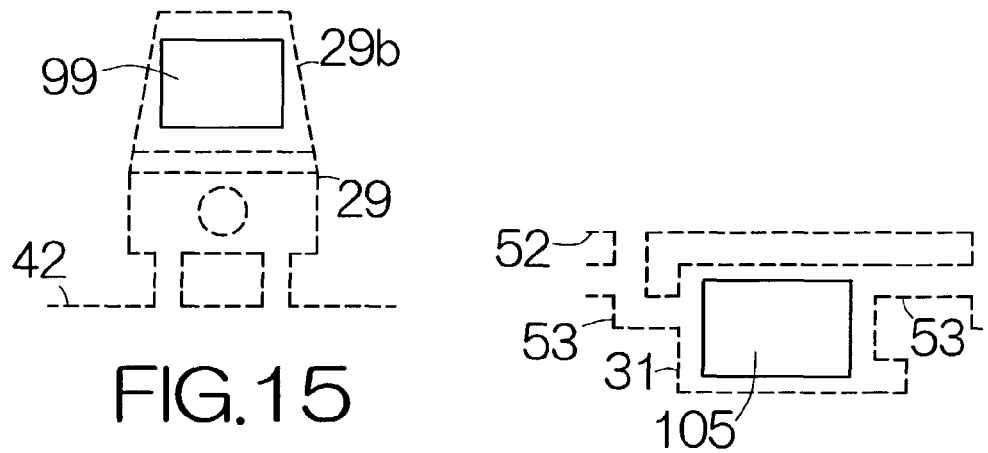
FIG.15
FIG.21
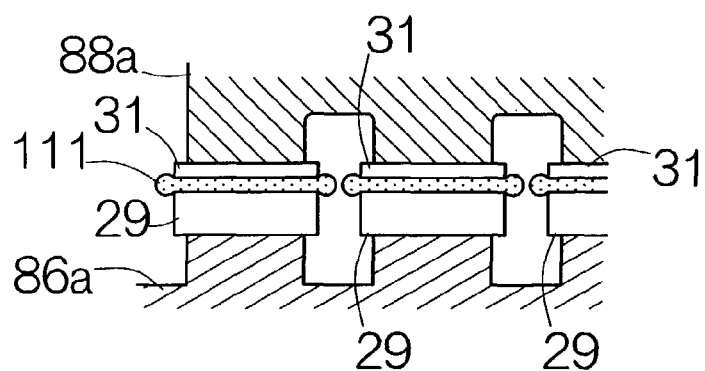
FIG.22

METHOD OF HEATING SUPERPOSED COMPONENTS AND HEATING APPARATUS THEREFOR

BACKGROUND OF THE INVENTION

1. Field of the Invention

The present invention relates to a method of heating superposed components, comprising superposing first and second components on a work stage, and allowing a heat block to contact with at least the second component so as to heat the first and second components. In particular, the invention relates to a heating apparatus utilized in the same method.

2. Description of the Prior Art

As conventionally known, a piezoelectric microactuator sometimes includes a pair of sheared piezoelectric elements. The piezoelectric elements in the form of a plate is interposed between a pair of electrode plates in the piezoelectric microactuator of this type. The electrode plates are individually adhered to the front and back surfaces of the piezoelectric element. A stationary microcomponent is adhered to one of the electrode plates, while a movable microcomponent is adhered to the other of the electrode plates. A thermosetting adhesive is in general employed to the adhesion. When a predetermined voltage is applied to the piezoelectric elements through the electrode plates, a relative rotation can be induced between the electrode plates, namely, between the microcomponents based on the shear of the piezoelectric elements.

The piezoelectric microactuator is often employed as a displacement controlling or positioning mechanism of a higher accuracy. A relative displacement or slippage should be avoided between the microcomponent and the electrode plate when both are adhered to each other. The microcomponent must be positioned at a higher accuracy relative to the electrode plate before actually heating the thermosetting adhesive between the microcomponent and the electrode plate. An expensive image recognition technique and an expensive positioning robot are required to achieve the accurate positioning of the microcomponent and the electrode plate. In addition, only a single set of the microcomponent and the electrode plate can be subjected to adhesion at a time.

SUMMARY OF THE INVENTION

It is accordingly an object of the present invention to provide a method of heating superposed components contributing to reduction in production cost and improvement in productivity, reliably avoiding a relative displacement or slippage between first and second components. In addition, it is another object of the present invention to provide a heating apparatus contributing to realization of the aforementioned method.

According to a first aspect of the present invention, there is provided a method of heating superposed components, comprising: setting a plurality of first components on a work stage, said first components commonly connected to a first connection member; superposing a plurality of second components on the first components, said second components commonly connected to a second connection member; and subjecting heat from the second components, preventing the first and second connection members from thermal expansion.

This method allows the first components as well as the second components to be handled as a one-piece component. Accordingly, the first and second components can be subjected to superposition and heating in a facilitated manner, as compared with the case where each component is separately handled. It leads to an improved productivity. In addition, the first and second connection members are prevented from thermal expansion during heating. The constant intervals are reliably maintained between the adjacent first components and the adjacent second components. The first and second components can in this manner be prevented from a relative displacement or slippage.

A thermosetting adhesive can be interposed between the first and second components. When the thermosetting adhesive has been heated, the first and second components are adhered to each other. A predetermined positional relationship is settled between the first and second components. The first positional relationship prior to heating is kept between the first and second components even after a rise in the temperature.

In particular, it is preferable to individually subject the second components to the heat. If the heat is allowed to conduct only to the second components in this manner, the connection member is reliably prevented from thermal expansion. Even if any connection member is interposed between the adjacent second components, such a connection member is reliably prevented from thermal expansion.

According to a second aspect of the present invention, there is provided a heating apparatus comprising: a work stage receiving a work; a heat block opposed to the work stage; at least a stripe of protrusion swelling from the surface of the heat block toward the work stage; and a plurality of heat surfaces defined on the top surface of the protrusion and individually contacting the work.

The heating apparatus allows the protrusion of the heat block to contact the work. The work receives the heat from the protrusion. A row of components connected to a common connection member can simultaneously be subjected to heat, for example. The separate contact of the heat surfaces allows the individual components to individually or separately get heated.

Slits may be defined on the protrusion between adjacent ones of the heat surfaces in the heating apparatus. Even when any connection member suffers from thermal expansion between the adjacent components, the slit is allowed to accept the bent or deformed connection member. The deformation of the connection member within the slit serves to maintain the interval between the adjacent components. Even if the adjacent components cannot thermally be isolated from each other enough, the components can be prevented from displacement or slippage because of the slit.

A difference in height is preferably set equal to or larger than 2.0 mm between the surface of the heat block and the top surface of the protrusion. The difference in height in this manner enables establishment of an airspace of a thickness of 2.0 mm or larger between the surface of the heat block and the work. The work is reliably prevented from receiving the heat from the heat surfaces in the vicinity of the heat surfaces. Rise in temperature can be suppressed in the connection member.

According to a third aspect of the present invention, there is provided a heating apparatus comprising: a work stage receiving a work; a heat block opposed to the work stage; at least a stripe of protrusion swelling from the surface of the heat block toward the work stage; a heat surface defined on the top surface of the protrusion for contacting the work; and a depression located on the surface of the heat block adjacent the protrusion and extending from the center to the outer side in the longitudinal direction of the protrusion.

An airspace can be defined between the heat block and the work. The thicker airspace can be established near the center of the longitudinal direction as compared with the airspace near the outer side of the longitudinal direction. The heat block is allowed to approach the work stage near the outer side of the longitudinal direction as compared with the center of the longitudinal direction. A heat radiation can be suppressed from the protrusion in the vicinity of the heat surface near the outer side as compared with the center of the longitudinal direction. Even if a single elongated heat generating unit is located along the longitudinal direction of the protrusion, it is thus possible to establish a constant temperature within the protrusion all over the longitudinal direction. The constant temperature can be established all over the heat surface. On the other hand, if an airspace of a constant thickness is formed between the heat block and the work stage over the entire longitudinal direction, heat tends to efficiently radiate from the protrusion near the outer side of the longitudinal direction. Difference in temperature is induced between the heat surface near the outer side and the heat surface near the center.

According to a fourth aspect of the present invention, there is provided a heating apparatus comprising: a work stage receiving a work; a heat block opposed to the work stage; a heat surface defined on the heat block for contacting the work on the work stage; a receiving surface defined on the surface of the work stage and opposed to the heat surface; and an endoergic surface defined on the work stage adjacent the receiving surface.

The work such as components is received on the receiving surface. For example, a connection member for connecting the components can be received on the endoergic surface adjacent the receiving surface. The heat of the connection member tends to conduct to the work stage through the endoergic surface. It is thus possible to suppress rise in the temperature of the connection member. The connection member is reliably prevented from thermal expansion. The endoergic surface may be made from a material having a higher thermal conductivity, for example.

According to a fifth aspect of the invention, there is provided a heating apparatus comprising: a work stage receiving a work; a heat block opposed to the work stage; a heat surface defined on the heat block for contacting the work on the work stage; and an insulating layer formed on the surface of the work stage and opposed to the heat surface of the heat block.

The work such as components is received on the insulating layer. The work is held between the insulating layer and the heat surface. When the heat of the heat surface is transferred to the work, the temperature of the work gets raised. The insulating layer serves to suppress a heat radiation from the work. The work can be heated in an efficient manner.

According to a sixth aspect of the present invention, there is provided a heating apparatus comprising: a work stage receiving a work; a heat block opposed to the work stage; a heat surface defined on the heat block for contacting the work on the work stage; a receiving surface defined on the surface of the work stage and opposed to the heat surface; and a groove formed on the surface of the work stage adjacent the receiving surface.

The work such as components is received on the receiving surface. When the heat of the heat surface is transferred to the work, the temperature of the work gets raised. In this case, the groove serves to establish an airspace adjacent the receiving surface. The receiving surface is thermally isolated from the periphery. The heat hardly radiates from the receiving surface. A heat radiation from the work can be suppressed in this manner. The work can be heated in an efficient manner.

According to a seventh aspect of the present invention, there is provided a heating apparatus comprising: a base set on a predetermined datum plane; a pallet detachably mounted on the base for receiving a work; a heat block opposed to the surface of the pallet; and a heat surface defined on the heat block for contacting the work on the pallet.

The pallets can be exchanged in the heating apparatus in a facilitated manner. The pallets can be prepared unique to the individual works. The pallets, unique to the individual works, are thus allowed to reliably receive the works over a broader contact area. The pallets are allowed to reliably receive the action or urging force from the corresponding heat surfaces. The work can reliably be held between the surface of the pallet and the heat surface of the heat block. The works can be conveyed along with the corresponding unique pallets. An improved productivity can be expected.

The aforementioned method and apparatus can be utilized to make a microactuator incorporated within a hard disk drive (HDD), for example. Otherwise, the aforementioned method and apparatus can be utilized to superpose components or members on another components or members. It should be noted that the first components connected to the first connection member are not required to have the identical shape. Also, the second components connected to the second connection member are not required to have the identical shape.

BRIEF DESCRIPTION OF THE DRAWINGS

The above and other objects, features and advantages of the present invention will become apparent from the following description of the preferred embodiment in conjunction with the accompanying drawings, wherein:

FIG. 14 is an enlarged partial sectional view taken along the line 14-14 in FIG. 13;

FIG. 15 is a schematic view illustrating the positional relationship between a receiving surface of the first pallet and the first attachment plate received on the receiving surface;

FIG. 21 is a schematic view illustrating the positional relationship between a heat surface of the first head and the first electrode plate receiving the heat surface; and FIG. 22 is a sectional view, corresponding to FIG. 19, schematically illustrating a thermosetting adhesive interposed between the first attachment plate and the first electrode plate.

DESCRIPTION OF THE PREFERRED EMBODIMENT

Figure 1:
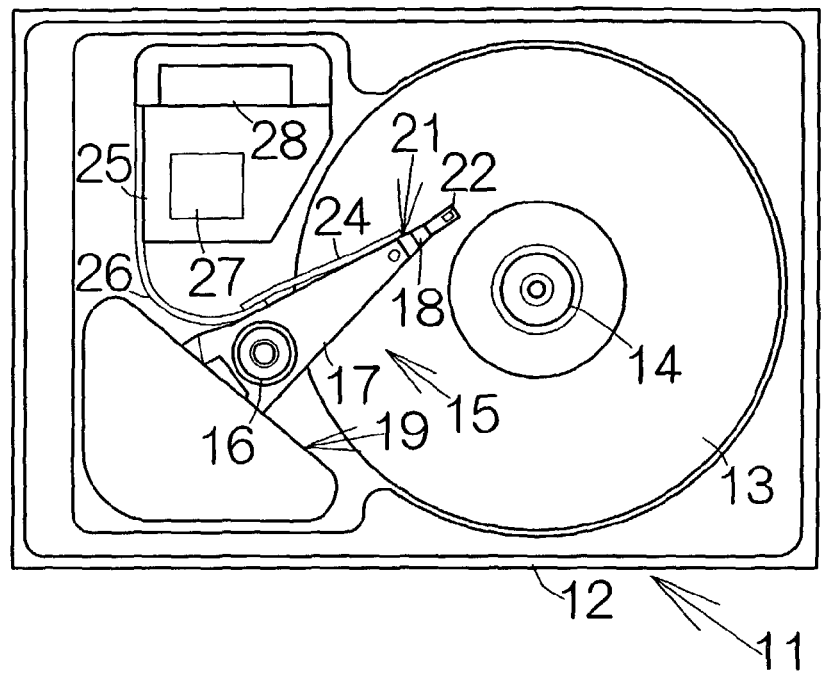
FIG. 1 is a plan view schematically illustrating the inner structure of a hard disk drive (HDD)

FIG. 1 schematically illustrates the inner structure of a hard disk drive (HDD) 11 as an example of a recording medium drive or storage device. The HDD 11 includes a box-shaped primary enclosure 12 defining an inner space of a flat parallelepiped, for example. At least one magnetic recording disk 13 is accommodated in the inner space within the primary enclosure 12. The magnetic recording disk 13 is mounted on a driving shaft of a spindle motor 14. The spindle motor 14 is allowed to drive the magnetic recording disk 13 for rotation at a higher revolution speed such as 7,200 rpm or 10,000 rpm, for example. A cover, not shown, is coupled to the primary enclosure 12 so as to define the closed inner space between the primary enclosure 12 and the cover itself.

A head assembly 15 is also accommodated in the inner space of the primary enclosure 12. The head assembly 15 is coupled to a vertical support shaft 16 for relative rotation. The head assembly 15 includes actuator arms 17 extending in the horizontal direction from the vertical support shaft 16, and elastic suspensions 18 respectively attached to the tip ends of the actuator arms 17 so as to extend in the forward direction from the actuator arms 17. The actuator arms 17 have a predetermined rigidity. The actuator arms 17 may be punched out of a stainless steel plate, for example. Alternatively, the actuator arms 17 may be formed by extrusion of an aluminum material. The actuator arms 17 are related to individual front and back surfaces of the magnetic recording disk 13. The actuator arms 17 are allowed to swing about the vertical support shaft 16. Any driving power source 19 such as a voice coil motor (VCM) may be utilized to realize the swinging movement of the actuator arm 17.

A microactuator 21 is interposed between the actuator arm 17 and the elastic suspension 18. The microactuator 21 is designed to cause a relative displacement or movement between the actuator arm 17 and the elastic suspension 18 in response to supply of a predetermined driving voltage. Such a relative displacement or movement may be represented by a swinging movement around a swinging axis at the tip end of the actuator arm 17, as described later in detail. The swinging axis of the swinging movement maybe set in parallel with the vertical support shaft 16.

A flying head slider 22 is cantilevered at the front or tip end of the elastic suspension 18 with the assistance of a gimbal spring, not shown. The elastic suspension 18 serves to urge the flying head slider 22 toward the surface of the magnetic recording disk 13. When the magnetic recording disk 13 rotates, the flying head slider 22 is allowed to receive airflow generated along the rotating magnetic recording disk 13. The airflow serves to generate a lift on the flying head slider 22. The flying head slider 22 is thus allowed to keep flying above the surface of the magnetic recording disk 13 during rotation of the magnetic recording disk 13 at a higher stability established by the balance between the lift and the urging force of the elastic suspension 18.

A magnetic head or electromagnetic transducer, not shown, is mounted on the flying head slider 22. The electromagnetic transducer may include a read element such as a giant magnetoresistive (GMR) element or a tunnel-junction magnetoresistive (TMR) element capable of reading magnetic information from the magnetic recording disk 13 based on the variation appearing in the electric resistance of a spin valve or tunnel-junction layered film, and a write element such as a thin film head capable of writing magnetic information into the magnetic recording disk 13 based on the magnetic field induced at a thin film coil pattern, for example.

When the actuator arm 17 of the head assembly 15 is driven to swing about the vertical support shaft 16, the elastic suspension 18 is caused to move in the radial direction of the magnetic recording disk 13. The elastic suspension 18 is also driven to swing about the swinging axis at the tip end of the actuator arm 17. The flying head slider 22 at the tip end of the elastic suspension 18 is allowed to move in the radial direction of the magnetic recording disk 13 in this manner. The collaboration of the actuator arm 17 and the elastic suspension 18 serves to position the electromagnetic transducer on the flying head slider 22 right above a target recording track on the magnetic recording disk 13. As conventionally known, the electromagnetic transducer on the flying head slider 22 is allowed to trace the target recording track at a higher accuracy based on a rough movement of the actuator arm 17 in addition to a fine movement of the elastic suspension 18 on the actuator arm 17.

As is apparent from FIG. 1, individual relay flexible printed circuit boards (FPCs) 24 and a common relay flexible printed circuit board (FPC) 26 are coupled to the head assembly 15. The individual relay FPCs 24 are designed to extend from the tip ends of the actuator arms 17 to the joint or root of the actuator arms 17. The common relay FPC 26 is designed to receive the individual relay FPCs 24 on the head assembly 15. The common relay FPC 26 extends from the head assembly 15 to a controlling circuit board 25. A head IC (Integrated Circuit) 27 is mounted on the controlling circuit board 25 for controlling read/write operations of the electromagnetic transducer, for example. The head IC 27 serves to supply a sensing current to the read element of the electromagnetic transducer and to process output signals generated in response to the supply of the sensing current. Likewise, the head IC 27 serves to supply write signals to the write element of the electromagnetic transducer. A connector 28 is connected to the controlling circuit board 25.

The connector 28 is fixed to the bottom plate of the primary enclosure 12. The connector 28 is electrically connected to a printed circuit board, not shown, coupled to the back of the bottom plate. For example, an actuator driver IC is mounted on the printed circuit board. The actuator driver IC is designed to generate analog controlling signals, namely, the driving voltage for the microactuator 21 based on predetermined digital controlling signals. An electrically-conductive printed pattern may be employed to establish the electric connection between the actuator driver IC and the connector 28, for example.

Figure 2:
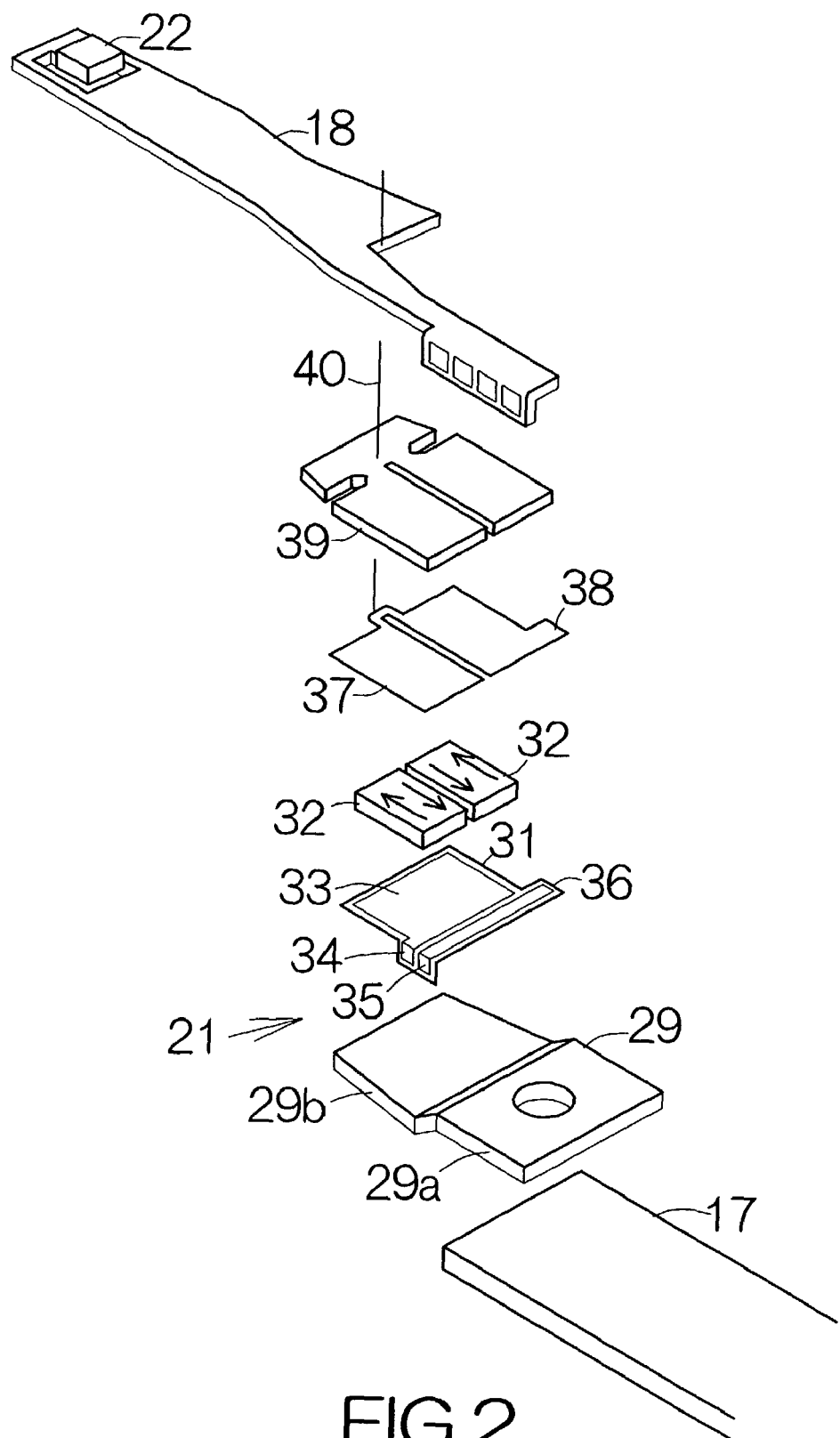
FIG. 2 is an enlarged exploded view schematically illustrating the structure of a microactuator.

As shown in FIG. 2, the microactuator 21 includes a first attachment plate 29 fixed to the tip end of the actuator arm 17. The first attachment plate 29 comprises a first plate member 29a superposed on and adhered to the surface of the actuator arm 17, and a second plate member 29b extending in the forward direction from the first plate member 29a. A step is defined between the first and second plate members 29a, 29b. Specifically, the second plate member 29b is allowed to extend over a level different from the level including the surface of the first plate member 29a. A first electrode plate 31 is adhered to the surface of the second plate member 29b. A thermosetting adhesive is employed to achieve the adhesion, for example.

The first electrode plate 31 comprises a substrate made of a stainless steel and an insulating coat covering over the surface of the substrate, for example. A conductive pad 33 is formed on the surface of the insulating coat for receiving a pair of sheared piezoelectric elements 32, 32. The piezoelectric elements 32, 32 may be adhered to the conductive pad 33. A thermosetting adhesive is employed to achieve the adhesion, for example. An electric connection can be established between the piezoelectric elements 32, 32 and the conductive pad 33 based on the surface roughness of the piezoelectric elements 32, 32 as well as of the conductive pad 33 irrespective of the interposal of the adhesive.

A pair of voltage terminals 34, 35 are integrally formed on the first electrode plate 31. The voltage terminals 34, 35 keep the upright attitude on the first electrode plate 31. The voltage terminals 34, 35 are designed to extend along the side of the actuator arm 17. The voltage terminals 34, 35 may be formed by folding a part of the material resulting in the first electrode plate 31. The voltage terminal 34 is connected to the conductive pad 33. An electrically conductive pattern is formed on the surface of the insulating coat for achieving the connection. The voltage terminal 35 is connected to a connection terminal 36. An electrically conductive pattern is formed to extend over the surface of the insulating coat across the first electrode plate 31 adjacent the conductive pad 33. The voltage terminal 35 and the connection terminal 36 are electrically isolated from the voltage terminal 34 and the conductive pad 33. An electrically conductive pattern, not shown, extending over the individual relay FPC 24 is connected to the voltage terminals 34, 35. The driving voltage of the aforementioned actuator driver IC is supplied to the voltage terminals 34, 35.

A second electrode plate 37 is adhered to the surfaces of the piezoelectric elements 32, 32. A thermosetting adhesive is employed to achieve the adhesion, for example. The second electrode plate 37 comprises a substrate made of a stainless steel and an insulating coat covering over the surface of the substrate, for example. A conductive pad, not shown, is formed on the surface of the insulating coat for contacting the piezoelectric elements 32, 32. The piezoelectric elements 32, 32 may be adhered to the conductive pad. A thermosetting adhesive is employed to achieve the adhesion, for example. An electric connection can be established between the piezoelectric elements 32, 32 and the conductive pad based on the surface roughness of the piezoelectric elements 32, 32 as well as of the conductive pad irrespective of the interposal of the adhesive.

A connection terminal 38 is formed on the second electrode plate 37. The connection terminal 38 is electrically connected to the conductive pad on the second electrode plate 37. The connection terminal 38 is also electrically connected to the connection terminal 36 of the first electrode plate 31.

When a driving voltage is supplied to the voltage terminals 34, 35, the piezoelectric elements 32, 32 is allowed to receive the driving voltage from the conductive pads on the first and second electrode plates 31, 37. The application of the driving voltage causes the piezoelectric elements 32, 32 to get sheared in the opposite directions.

A second attachment plate 39 is adhered to the surface of the second electrode plate 37. A thermosetting adhesive is employed to achieve the adhesion, for example. The base or root end of the elastic suspension 18 is superposed and fixed on the surface of the second attachment plate 39. When the piezoelectric elements 32, 32 get sheared in the aforementioned manner, the elastic suspension 18 is caused to swing about the swinging axis 40 relative to the actuator arm 17.

Figure 3:
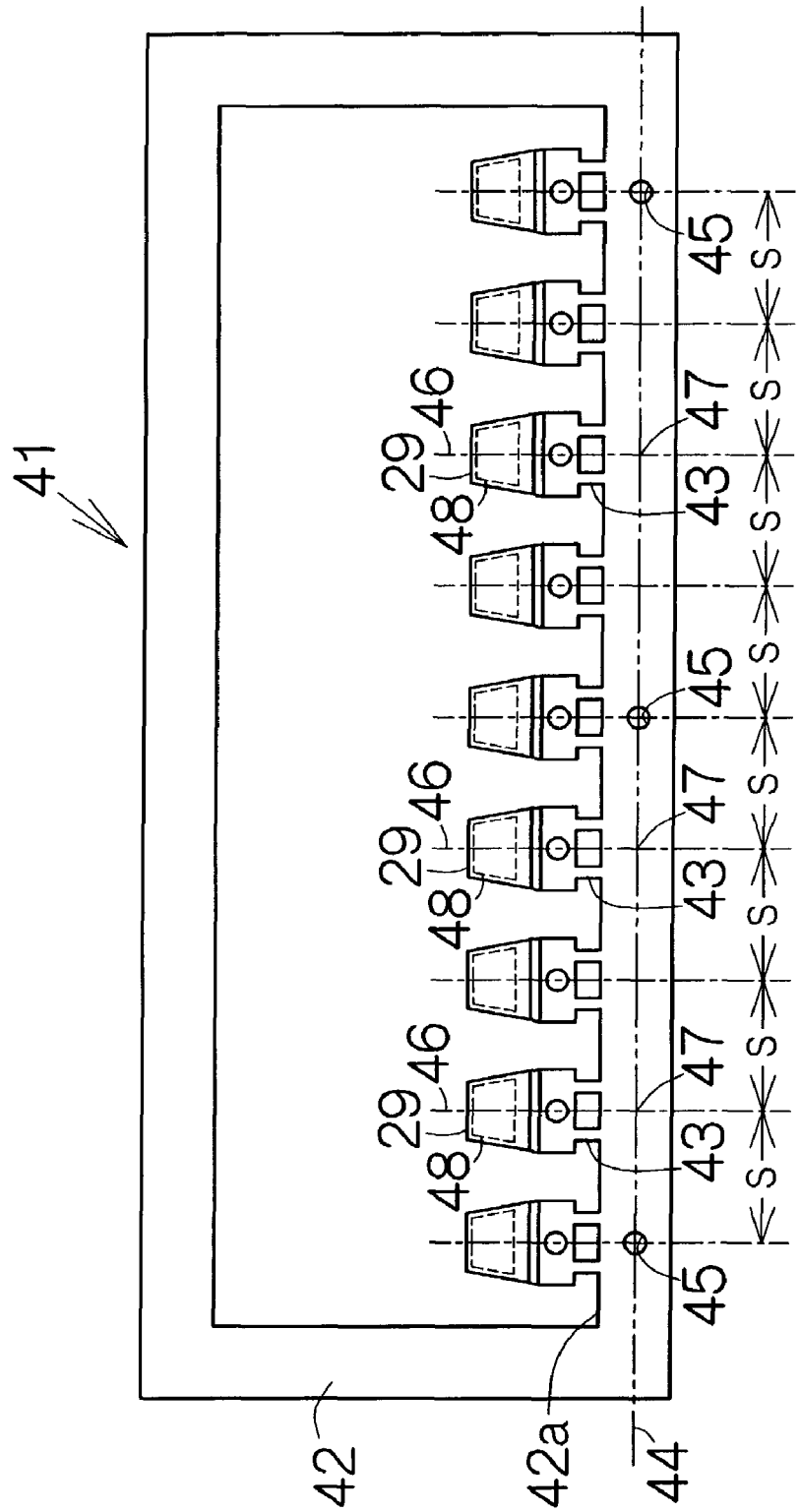
FIG. 3 is a plan view schematically illustrating a first plate material including first attachment plates of the microactuator.

Next, a brief description will be made on a method of making the microactuator 21. A first plate material 41 is first prepared, as shown in FIG. 3, for example. The first plate material 41 includes two or more (nine) first attachment plates 29. A rectangular connection member or frame plate 42 is included in the first plate material 41. The first attachment plates 29 are individually connected to a longer side of the rectangle, namely, an elongated plate 42a. An attachment piece 43 is utilized to achieve the connection of the first attachment plate 29 with the elongated plate 42a. The frame plate 42, the attachment pieces 43 and the first attachment plates 29 are all punched out of a single metallic plate such as a stainless steel plate, for example. The thickness of the metallic plate and the first plate material 41 may be set at approximately 100 μm.

Positioning through holes 45 are formed in the frame plate 42. The positioning through holes 45 are arranged on a straight line 44. The individual first attachment plates 29 are located at predetermined positions related to the straight line 44 established based on the positioning through holes 45. Here, datum lines 46 for determining the attitude of the individual first attachment plates 29 may intersect the straight line 44 at right angles. And also, the intersections 47 of the straight line 44 and the individual datum lines 46 may be spaced at regular intervals s. A common positional relationship should be established between the datum lines 46 and the corresponding contours of the first attachment plates 29. Adhesive receiving area 48 is defined on the second plate member 29b based on the datum line 46 in the individual first attachment plate 29. Accordingly, a common positional relationship is established between the datum lines 46 and the corresponding adhesive receiving areas 48 in the individual first attachment plates 29.

Figure 4:
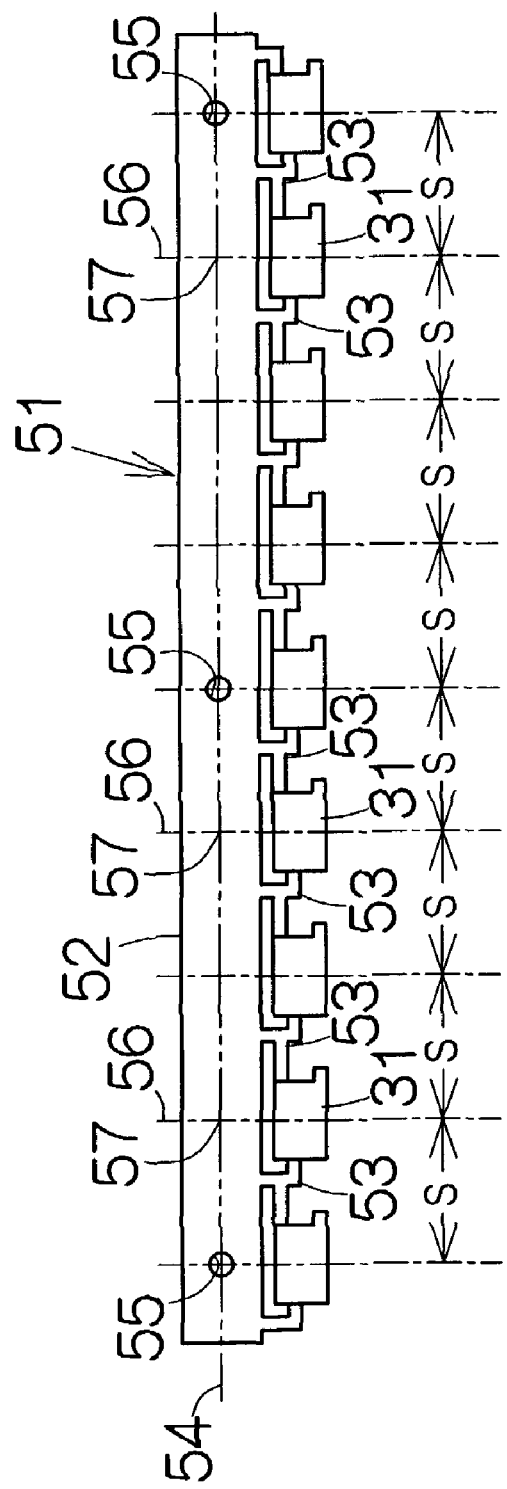
FIG. 4 is a plan view schematically illustrating a second plate material including first electrode plates of the microactuator.

As shown in FIG. 4, a second plate material 51 is also prepared. The second plate material 51 includes two or more (nine) first electrode plates 31. The number of the first electrode plate 31 should be set equal to the number of the first attachment plate 29 included in the first plate material 41. The second plate material 51 includes an elongated connection member or plate 52. The first electrode plates 31 are individually connected to the connection plate 52. An attachment piece 53 is utilized to achieve the connection of the first electrode plate 31 with the connection plate 52. The attachment pieces 53 also serve to connect the adjacent first electrode plates 31. The connection plate 52, the attachment pieces 53 and the first electrode plates 31 are all punched out of a single metallic thin plate such as a stainless steel plate, for example. The insulating coat, the conductive pad 33, the connection terminal 36 and the electrically conductive pattern are previously formed over the surface of the metallic thin plate. The voltage terminals 34, 35 may be established by folding the metallic thin plate when the second plate material 41 is punched out. Here, the thickness of the second plate material 51 may be set at approximately 25 μm, for example.

Positioning through holes 55 are formed in the connection plate 52. The positioning through holes 55 are arranged on a straight line 54. The individual first electrode plates 31 are located at predetermined positions related to the straight line 54 established based on the positioning through holes 55. The locations of the first electrode plates 31 reflect the locations of the adhesive receiving areas 48 defined in the first plate material 41. Here, datum lines 56 for determining the attitude of the individual first electrode plates 31 may intersect the straight line 54 at right angles. And also, the intersections 57 of the straight line 54 and the individual datum lines 56 maybe spaced at regular intervals s in the aforementioned manner. A common positional relationship should be established between the datum lines 56 and the corresponding contours of the first electrode plates 31.

Figure 5:
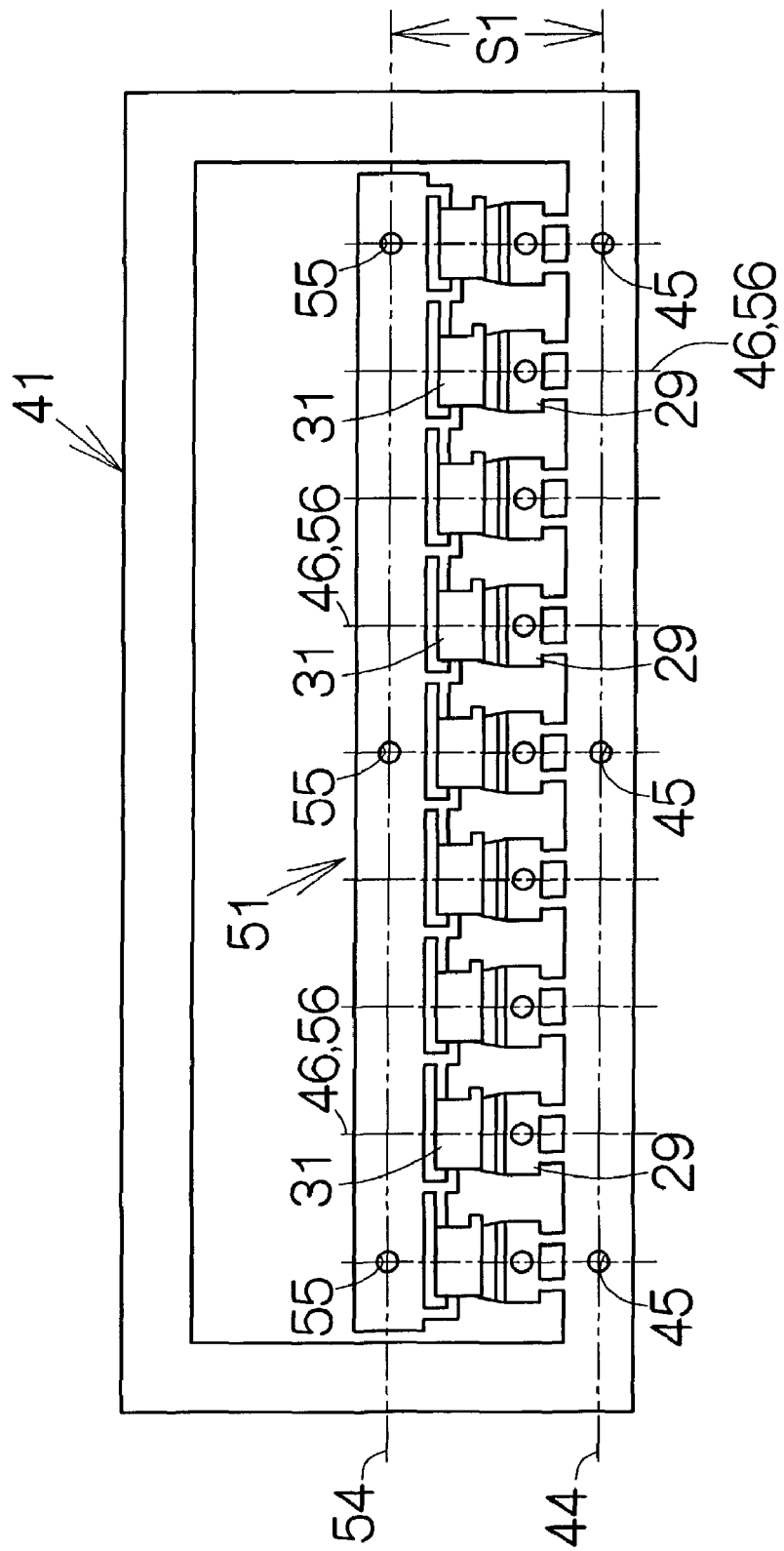
FIG. 5 is a plan view illustrating the second plate material superposed on the first plate material.

The second plate material 51 is superposed on the first plate material 41. As shown in FIG. 5, the straight line 54 of the second plate material 51 is positioned in parallel with the straight line 44 of the first plate material 41. A predetermined interval S1 is set between the straight lines 44, 54. The positioning through holes 45, 55 in the first and second plate materials 41, 51 are utilized to position the straight lines 44, 54. The intervals s between the adjacent first attachment plates 29 are set equal to the intervals s between the adjacent first electrode plates 31, so that all the datum lines 56 in the second plate material 51 are aligned with the corresponding datum lines 46 in the first plate material 41 when one of the datum lines 56 is aligned with corresponding one of the datum lines 46. In this manner, the first electrode plates 31 are individually superposed on the corresponding adhesive receiving areas 48 of the first attachment plates 29. A thermosetting adhesive is applied to the surface of the first attachment plates 29 prior to the superposition. The thermosetting adhesive may contain an epoxy resin, for example. The first attachment plates 29 and the first electrode plates 31 are then subjected to heat after the superposition. As the thermosetting adhesive gets cured, the positional relationship is settled between the individual first attachment plate 29 and the corresponding first electrode plate 31.

Figure 6:
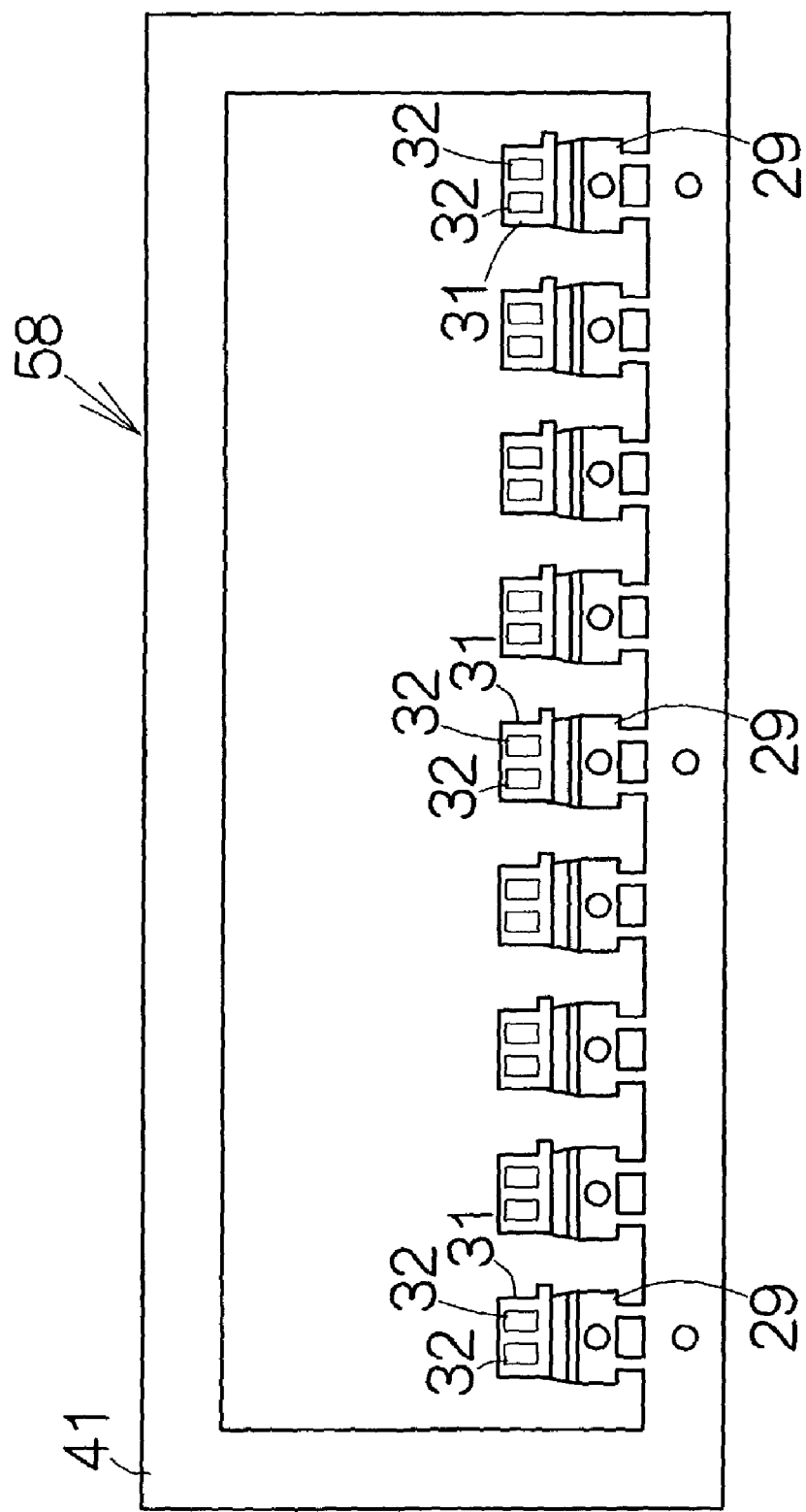
FIG. 6 is a plan view illustrating piezoelectric elements superposed on the first electrode plates in a first double material.

Thereafter, the connection plate 52 is separated from the first electrode plates 31 by cutting. The attachment pieces 53 are also removed from the first electrode plates 31 along with the connection plate 52. As shown in FIG. 6, a pair of the piezoelectric elements 32, 32 are then adhered to the individual first electrode plate 31. A thermosetting adhesive may be employed to achieve the adhesion, for example. As the thermosetting adhesive gets cured, a predetermined positional relationship is settled between the piezoelectric elements 32, 32 and the corresponding first electrode plate 31, namely, the corresponding first attachment plate 29. In this manner, a first double material 58 is obtained.

Figure 7:
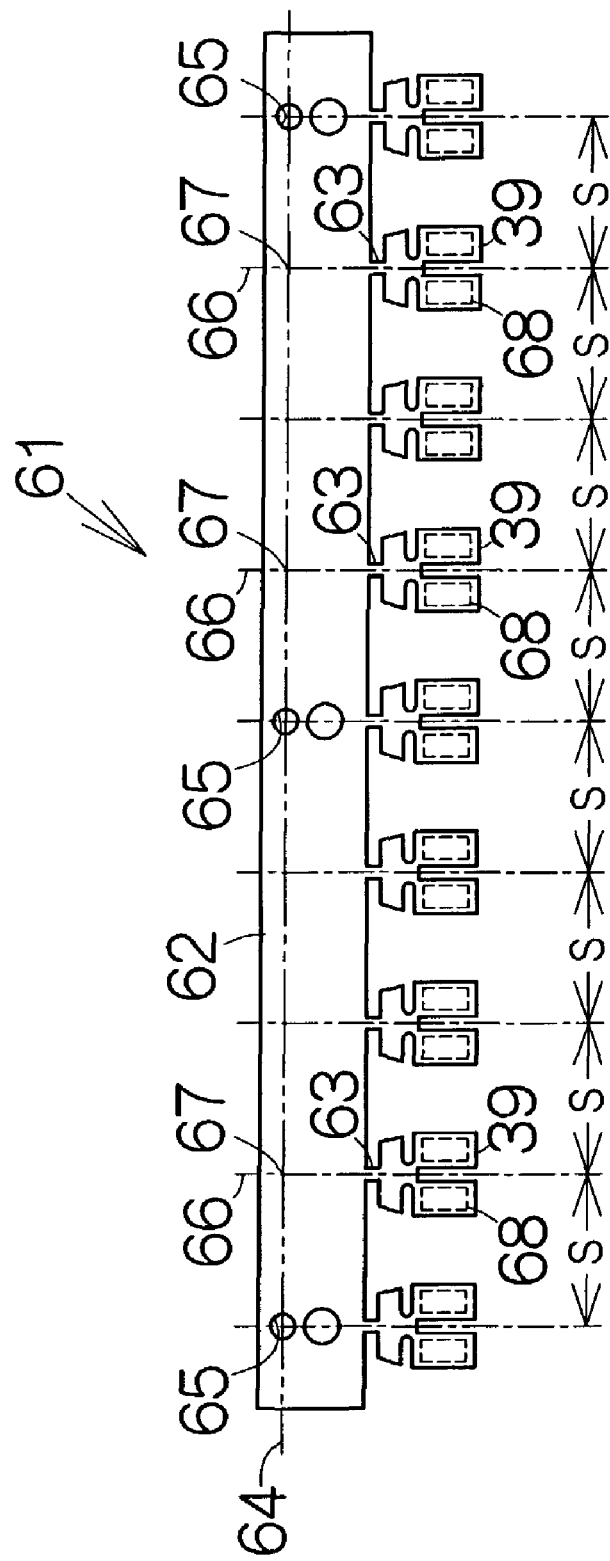
FIG. 7 is a plan view schematically illustrating a third plate material including second attachment plates of the microactuator.

Next, a third plate material 61 is prepared, as shown in FIG. 7, for example. The third plate material 61 includes two or more (nine) second attachment plates 39. The number of the second attachment plate 39 should be set equal to the number of the first attachment plate 29 included in the first plate material 41. The third plate material 61 includes an elongated connection member or plate 62. The second attachment plates 39 are individually connected to the connection plate 62. An attachment piece 63 is utilized to achieve the connection of the second attachment plate 39 with the connection plate 62. The connection plate 62, the attachment pieces 63 and the second attachment plates 39 are all punched out of a single metallic plate such as a stainless steel plate, for example. Here, the thickness of the third plate material 61 may be set at approximately 100 μm, for example.

Positioning through holes 65 are formed in the connection plate 62. The positioning through holes 65 are arranged on a straight line 64. The individual second attachment plates 39 are located at predetermined positions related to the straight line 64 established based on the positioning through holes 65. The locations of the second attachment plates 39 reflect the locations of the first attachment plates 29. Here, datum lines 66 for determining the attitude of the individual second attachment plates 39 may intersect the straight line 64 at right angles. And also, the intersections 67 of the straight line 64 and the individual datum lines 66 may be spaced at regular intervals s in the aforementioned manner. A common positional relationship should be established between the datum lines 66 and the corresponding contours of the second attachment plates 39. Adhesive receiving area 68 is defined on the individual second attachment plate 39 based on the datum line 66. Accordingly, a common positional relationship is established between the datum lines 66 and the corresponding adhesive receiving areas 68 in the individual second attachment plates 39.

Figure 8:
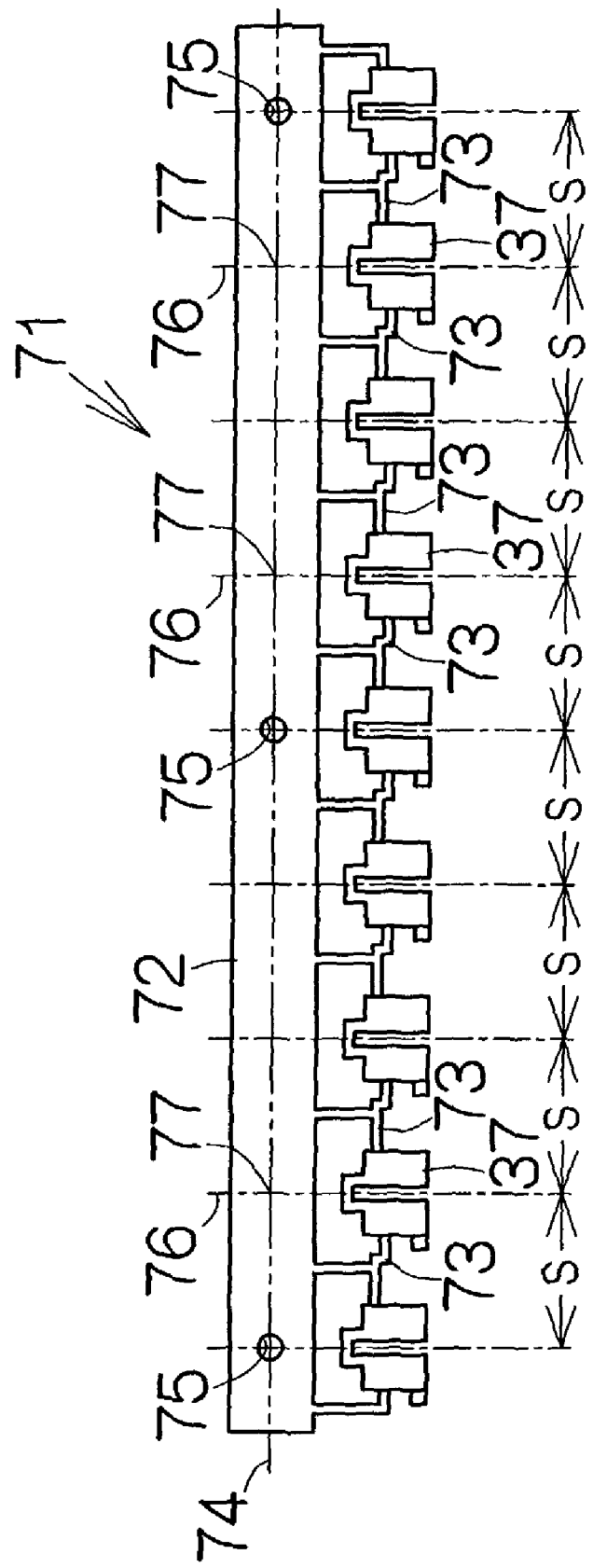
FIG. 8 is a plan view schematically illustrating a fourth plate material including second electrode plates of the microactuator.

As shown in FIG. 8, a fourth plate material 71 is further prepared. The fourth plate material 71 includes two or more (nine) second electrode plates 37. The number of the second electrode plate 37 should be set equal to the number of the first attachment plate 29 included in the first plate material 41. The fourth plate material 71 includes an elongated connection member or plate 72. The second electrode plates 37 are individually connected to the connection plate 72. An attachment piece 73 is utilized to achieve the connection of the second electrode plate 37 with the connection plate 72. The attachment pieces 73 also serve to connect the adjacent second electrode plates 37. The connection plate 72, the attachment pieces 73 and the second electrode plates 37 are all punched out of a single metallic thin plate such as a stainless steel plate, for example. The insulating coat, the conductive pad and the connection terminal 38 are previously formed over the surface of the metallic thin plate. Here, the thickness of the fourth plate material 71 may be set at approximately 25 μm, for example.

Positioning through holes 75 are formed in the connection plate 72. The positioning through holes 75 are arranged on a straight line 74. The individual second electrode plates 37 are located at predetermined positions related to the straight line 74 established based on the positioning through holes 75. The locations of the second electrode plates 37 reflect the locations of the adhesive receiving areas 68 defined in the third plate material 61. Here, datum lines 76 for determining the attitude of the individual second electrode plates 37 may intersect the straight line 74 at right angles. And also, the intersections 77 of the straight line 74 and the individual datum lines 76 maybe spaced at regular intervals s in the aforementioned manner. A common positional relationship should be established between the datum lines 76 and the corresponding contours of the second electrode plates 37.

Figure 9:
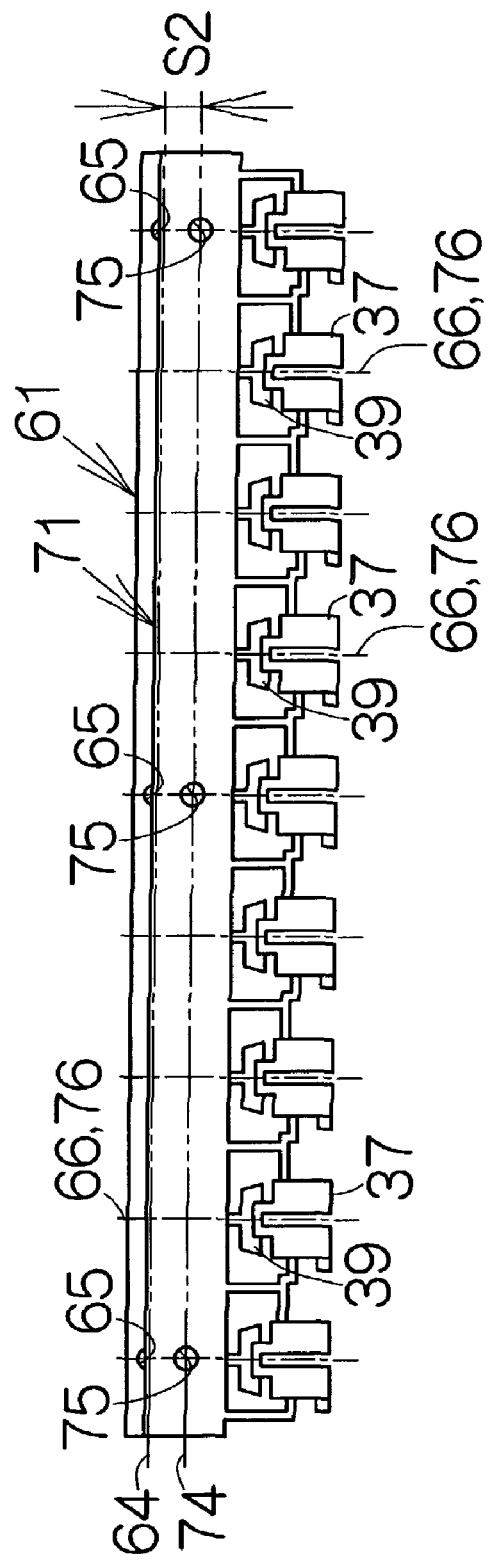
FIG. 9 is a plan view illustrating the fourth plate material superposed on the third plate material.
Figure 10:
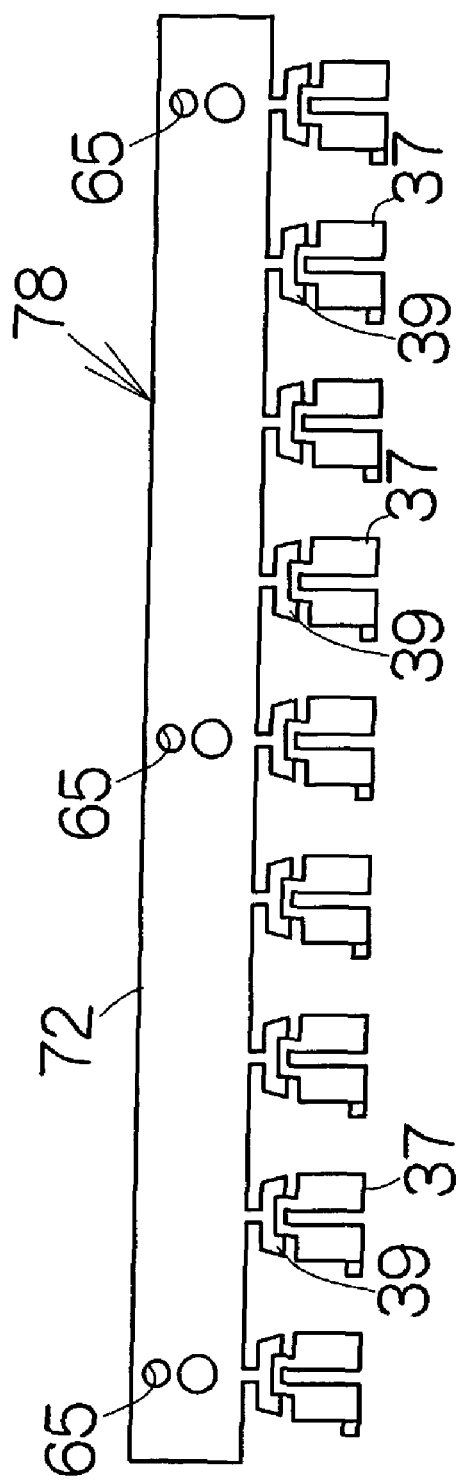
FIG. 10 is a plan view illustrating a second double material.

The fourth plate material 71 is superposed on the third plate material 61. The fourth plate material 71 is reversed prior to the superposition. As shown in FIG. 9, the straight line 74 of the fourth plate material 71 is positioned in parallel with the straight line 64 of the third plate material 61. A predetermined interval S2 is set between the straight lines 64, 74. The positioning through holes 65, 75 in the third and fourth plate materials 61, 71 are utilized to position the straight lines 64, 74. The intervals s between the adjacent second attachment plates 39 are set equal to the intervals s between the adjacent second electrode plates 37, so that all the datum lines 76 in the fourth plate material 71 are aligned with the corresponding datum lines 66 in the third plate material 61 when one of the datum lines 76 is aligned with corresponding one of the datum lines 66. In this manner, the second electrode plates 37 are individually superposed on the corresponding adhesive receiving areas 68 of the second attachment plates 39. A thermosetting adhesive is applied to the surface of the second attachment plates 39 prior to the superposition. The thermosetting adhesive may contain an epoxy resin, for example. The second attachment plates 39 and the second electrode plates 37 are then subjected to heat after the superposition. As the thermosetting adhesive gets cured, the positional relationship is settled between the individual second attachment plate and the corresponding second electrode plate 37. Thereafter, the connection plate 72 is separated from the second electrode plates 37 by cutting, as shown in FIG. 10. The attachment pieces 73 are also removed from the second electrode plates 37 along with the connection plate 72. In this manner, a second double material 78 is obtained.

Figure 11:
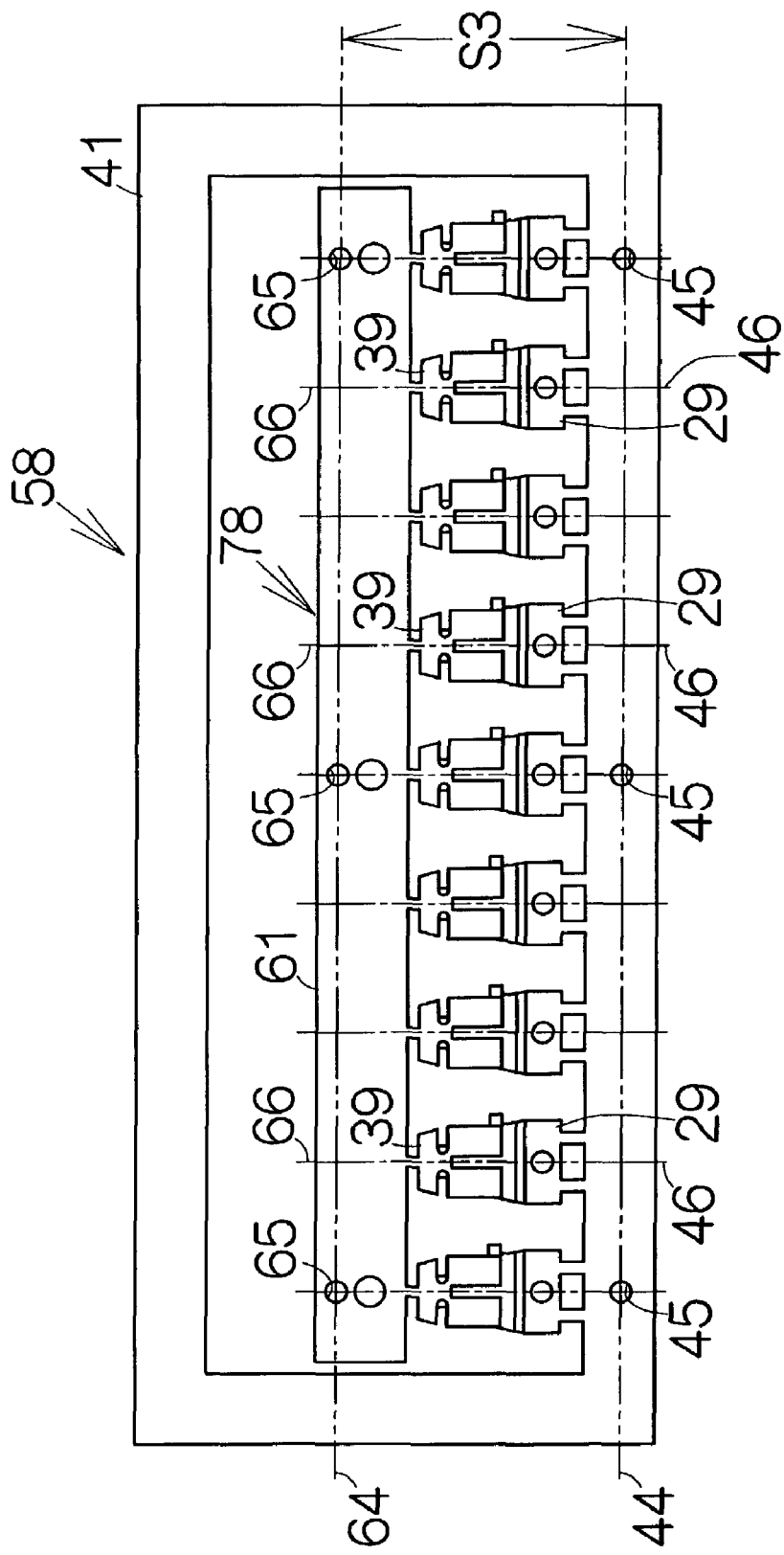
FIG. 11 is a plan view illustrating the second double material superposed on the first double material.

The second double material 78 is thereafter superposed on the first double material 58. As shown in FIG. 11, the straight line 64 of the third plate material 61 is positioned in parallel with the straight line 44 of the first plate material 41. A predetermined interval S3 is set between the straight lines 44, 64. The positioning through holes 45, 65 in the first and third plate materials 41, 61 are utilized to position the straight lines 44, 64. The intervals s between the adjacent second attachment plates 39 are set equal to the intervals s between the adjacent first attachment plates 29, so that all the datum lines 66, 76 in the second double material 78 are aligned with the corresponding datum lines 46, 56 in the first attachment material 58 when one of the datum lines 66, 76 in the second double material 78 is aligned with corresponding one of the datum lines 46, 56 in the first double material 58. In this manner, the second electrode plates 37 are individually superposed on the corresponding first electrode plates 31. The piezoelectric elements 32, 32 are interposed between the first and second electrode plates 31, 37. A thermosetting adhesive is applied to the surfaces of the piezoelectric elements 32, 32 prior to the interposal. The thermosetting adhesive may contain an epoxy resin, for example. The first and second double materials 58, 78 are then subjected to heat after the interposal. As the thermosetting adhesive gets cured, the positional relationship is settled between the individual second electrode plate 37 and the corresponding piezoelectric elements 32, 32.

Thereafter, the connection plate 62 is separated from the second attachment plates 39 by cutting. The attachment pieces 63 are also removed from the second attachment plates 39 along with the connection plate 62. The first attachment plates 29, the first electrode plates 31, the piezoelectric elements 32, the second electrode plates 37 and the second attachment plates 39 are again placed in an oven. The heat in the oven has the thermosetting adhesive get completely cured. The frame plate 42 is finally separated from the first attachment plates 29 by cutting. The attachment pieces 43 are also removed from the first attachment plates 29 along with the frame plate 42. In this manner, the microactuator 21 is obtained.

The above-described method allows the first attachment plates 29, the first electrode plates 31, the piezoelectric elements 32, the second electrode plates 37 and the second attachment plates 39 in the individual plate materials 41, 51, 61, 71 to be handled as a one-piece component. Accordingly, the attachment plates 29, 39 and the electrode plates 31, 37 included in the plate materials 41, 51, 61, 71 can be subjected to superposition and heating in a facilitated manner, as compared with the case where the attachment plates 29, 39 and the electrode plates 31, 37 are separately adhered. It leads to an improved productivity. In addition, a simple mechanism such as the combination of the positioning through holes 45, 55, 65, 75 is utilized to position the plate materials 41, 51, 61, 71 as well as the first and second double materials 58, 78. The positioning at a higher accuracy can be realized without an expensive image recognition technique and an expensive positioning robot. The production cost is remarkably reduced.

Figure 12:
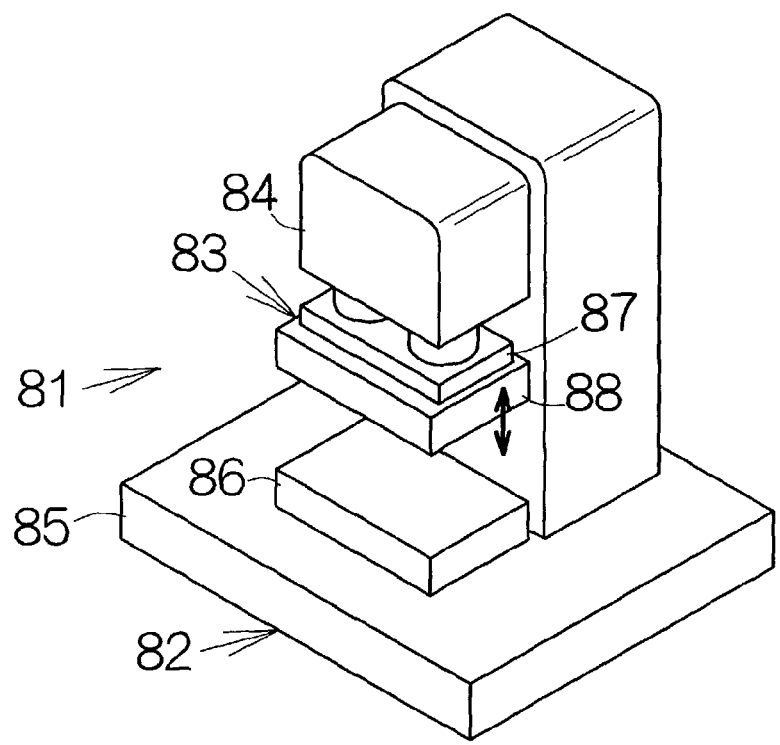
FIG. 12 is a perspective view schematically illustrating the structure of a heating apparatus according to the present invention.

FIG. 12 illustrates a heating apparatus 81 employed to achieve the adhesion of the plate materials 41, 51, 61, 71 as well as the double materials 58, 78. The heating apparatus 81 includes a work stage 82 receiving a work. A heat block 83 is positioned above the work stage 82. The lower surface of the heat block 83 is opposed to the upper surface of the work stage 82. A pressurized cylinder 84 is connected to the heat block 83. The pressurized cylinder 84 is designed to move the heat block 83 upward and downward. The heat block 83 is thus allowed to approach the work stage 82 and get distanced from the work stage 82 based on the action of the pressurized cylinder 84. In addition, the pressurized cylinder 84 serves to urge the heat block 83 against the work stage 82.

The work stage 82 includes a stationary base 85 placed on a predetermined datum plane such as a floor. A pallet 86 is detachably mounted on the base 85. The pallet 86 receives the work. The pallet 86 may be made of a metallic material such as a stainless steel, for example. The pallet 86 will be described later in detail.

The heat block 83 includes a heat source block 87 connected to the pressurized cylinder 84. The heat source block 87 may include a ceramic heater, for example. A head 88 is detachably coupled to the lower surface of the heat source block 87. A heat surface is defined on the head 88 for contacting the work on the pallet 86 as described later in detail. The heat generated at the heat source block 87 is transferred to the head 88. The heated head 88 contacts the work at the heat surface, so that the work is heated.

The heating apparatus 81 is designed to accept various types of the pallet 86 and the head 88. The pallet 86 and the head 88 are selected depending on the kinds of works subjected to heat. If the heating apparatus 81 is utilized in making the aforementioned microactuator 21, the pallet 86 and the head 88 unique to the adhesion between the first and second plate materials 41, 51 are set into the heating apparatus 81 in making the first double material 58. Likewise, the pallet 86 and the head 88 unique to the adhesion between the third and fourth plate materials 61, 71 are set into the heating apparatus 81 in making the second double material 78. Still further, the pallet 86 and the head 88 unique to the adhesion between the first and second double materials 58, 78 are set into the heating apparatus 81 in making the microactuator 21. In the case where these three kinds of the pallets 86 and the heads 88 are utilized in the single heating apparatus 81, the pallet 86 and the head 88 are exchanged every time the corresponding adhesion has been completed. Alternatively, three of the heating apparatuses 81 may be prepared for the individual sets of the pallet 86 and the head 88. The preparation of the heating apparatuses 81 specific to the individual sets serves to omit the exchange of the heads 88, so that the working time can be shortened. At the same time, the heat loss due to the exchange of the heads 88 can be avoided.

Figure 13:
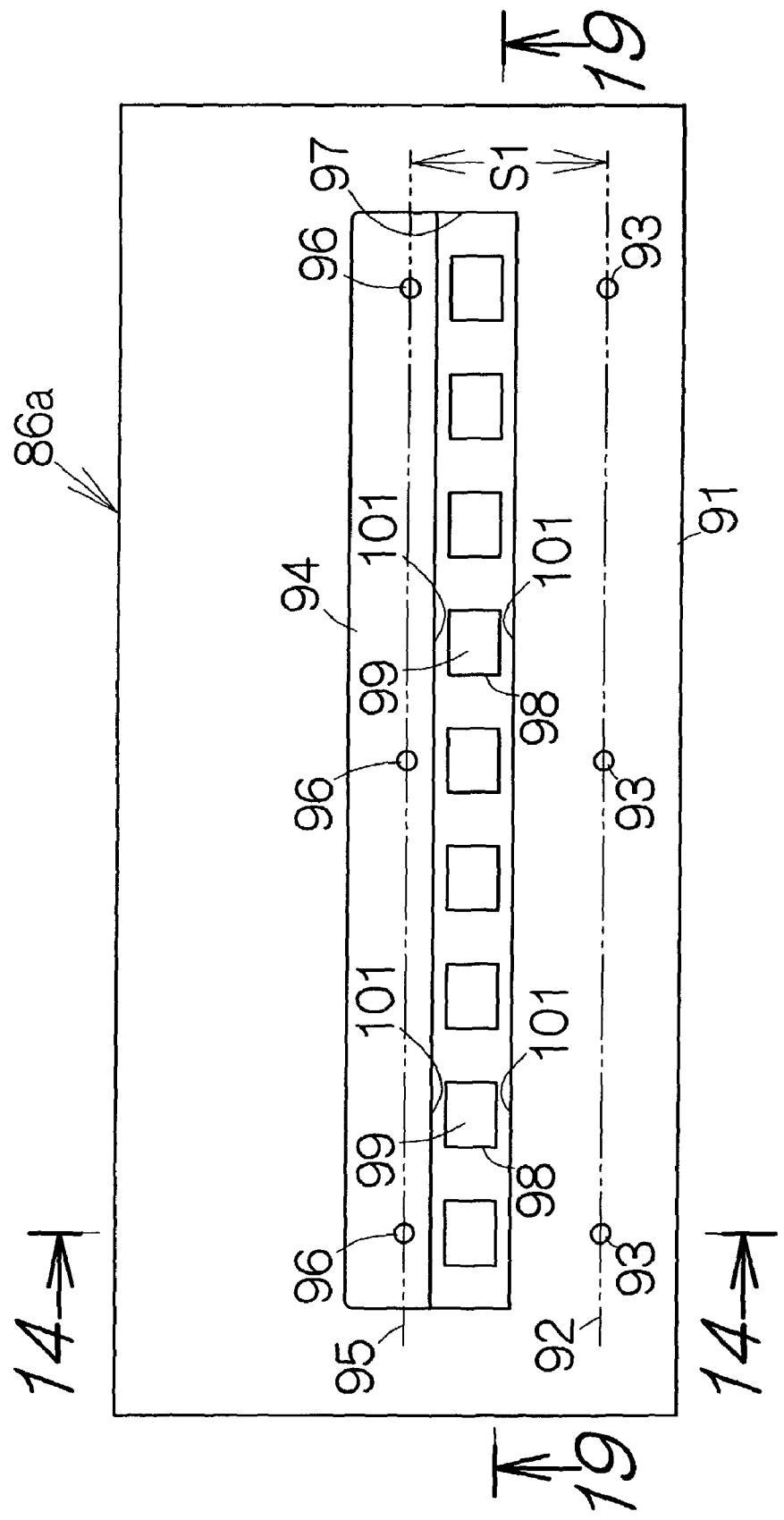
FIG. 13 is plan view schematically illustrating the structure of a pallet.

FIG. 13 illustrates a first pallet 86a mounted on the heating apparatus 81 in making the first double material 58. A first flat datum surface 91 is defined in the first pallet 86a. The first datum surface 91 serves as an endoergic surface. First positioning pins 93 are arranged on a first straight line 92 over the first datum surface 91. The first positioning pins 93 stand upright to the first datum surface 91. When the first double material 58 is to be made, the frame plate 42 of the first plate material 41 is received on the first datum surface 91. The first positioning pins 93 are allowed to enter the positioning through holes 45 of the first plate material 41. The straight line 44 of the first plate material 41 is aligned with the first straight line 92 in this manner.

Likewise, a second flat datum surface 94 is defined on the first pallet 86a. The second datum surface 94 also serves as an endoergic surface. The second datum surface 94 is positioned on a level lower than that of the first datum surface 91. Second positioning pins 96 are arranged on a second straight line 95 over the second datum surface 94. The second straight line 95 is set to extend in parallel with the first straight line 92. The second positioning pins 96 stand upright to the second datum surface 94. The space or distance between the first and second straight lines 92, 95 is set equal to the interval S1 established between the straight line 44 of the first plate material 41 and the straight line 54 of the second plate material 51 when the second plate material 51 is superposed on the first plate material 41 in the aforementioned manner. When the first double material 58 is to be made, the connection plate 52 of the second plate material 51 is received on the second datum surface 94. The second positioning pins 96 are allowed to enter the positioning through holes 55 of the second plate material 51. The straight line 54 of the second plate material 51 is aligned with the second straight line 95 in this manner.

A depression 97 is defined in the first datum surface 91 between the first and second straight lines 92, 95. Pedestals 98 are disposed in the depression 97. The number of the pedestal 98 should be set equal to the number of the first attachment plates 29 included in the first plate material 41. A flat receiving surface 99 is defined on the top of the pedestal 98. All the receiving surfaces 99 are arranged within a plane. The location of the receiving surfaces 99 is determined based on the location of the second plate members 29b established when the first plate material 41 is positioned based on the combination of the first positioning pins 93 and the positioning through holes 45. The depression 97 and the pedestals 98 in combination serve to define heat insulating grooves 101 between the individual receiving surfaces 99 and the first and second datum surfaces 91, 94. The depth of the heat insulating grooves 101 may be set in a range between 1.0 mm and 2.0 mm from the level of the second datum surface 94, for example.

As shown in FIG. 14, when the first plate material 41 is placed on the first pallet 86a based on the combination of the first positioning pins 93 and the positioning through holes 45, the frame plate 42 of the first plate material 41 is received on the first datum surface 91 of the first pallet 86a. The entire back surface of the frame plate 42 contacts the first datum surface 91 serving as the endoergic surface. The second plate members 29b of the first attachment plates 29 are received on the corresponding receiving surfaces 99 on the pedestals 98. The receiving surface 99 contacts the back surface of the second plate member 29b over the entire area.

When the second plate material 51 is placed on the first pallet 86a based on the combination of the second positioning pins 96 and the positioning through holes 55, the connection plate 52 of the second plate material 51 is received on the second datum surface 94 of the first pallet 86a. The entire back surface of the connection plate 52 contacts the second datum surface 94 serving as the endoergic surface. The first electrode plates 31 included in the second plate material 51 are received on the corresponding surfaces of the first attachment plates 29 on the pedestals 98. The first electrode plates 31 contacts the corresponding adhesive receiving areas 48 of the first attachment plates 29 over the entire area. The second plate material 51 is superposed on the first plate material 41 in this manner.

As shown in FIG. 15, the overall periphery of the individual receiving surface 99 is set smaller than the contour of the corresponding first attachment plate 29. Specifically, when the second plate member 29b of the first attachment plate 29 is received on the receiving surface 99, the second plate member 29b constantly protrudes outward from the periphery of the receiving surface 99. The size of the receiving surface 99 may be set enough to raise the temperature of the second plate member 29b that is interposed between the heat surface of the head 88 and the receiving surface 99 when the heat surface is urged against the receiving surface 99. Here, the space or distance between the contours of the receiving surface 99 and of the second plate member 29b is set in a range between 100 μm and 200 μm, for example.

Figure 16:
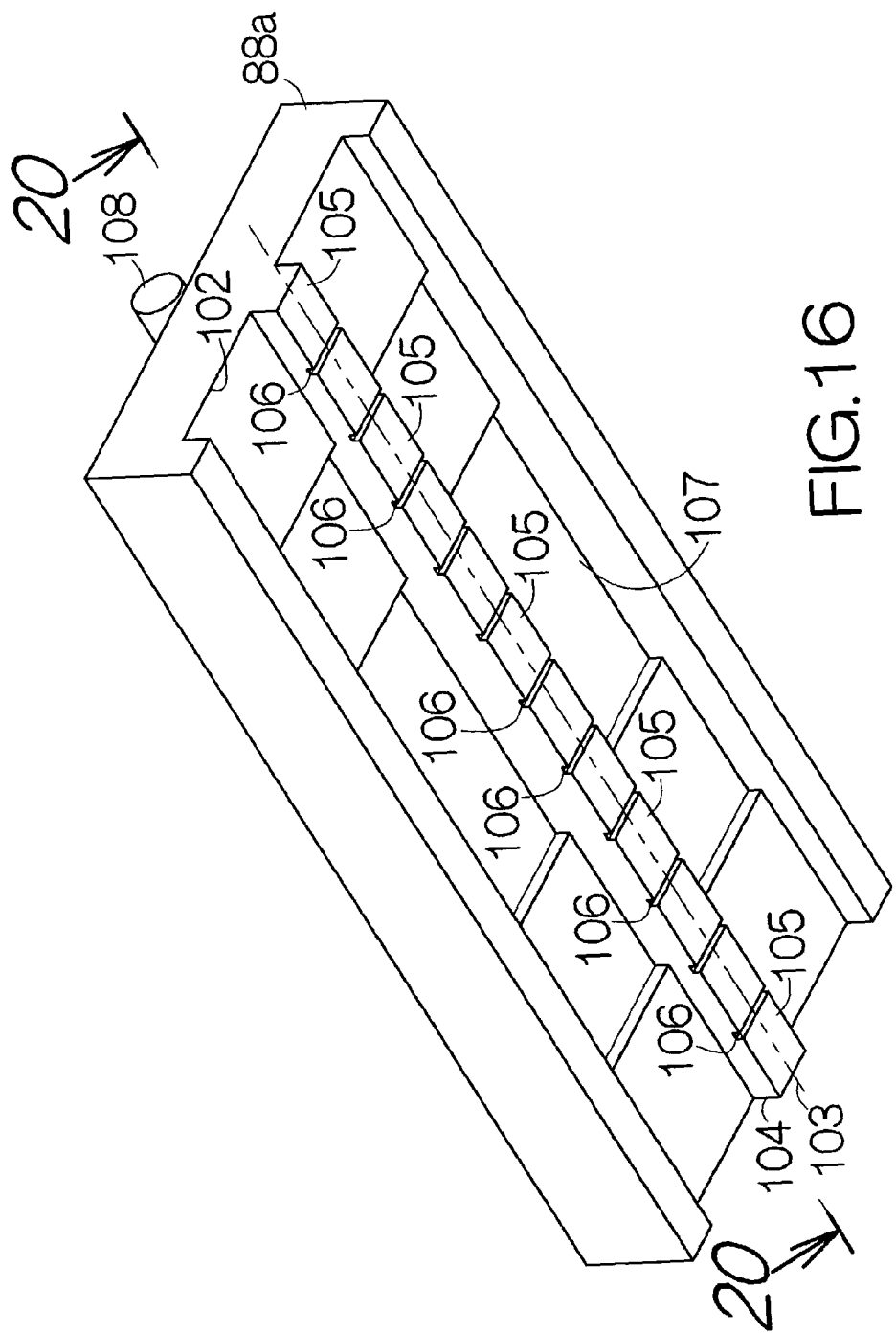
FIG. 16 is a perspective view schematically illustrating the structure of a first head.

FIG. 16 illustrates a first head 88a mounted on the heating apparatus 81 in making the first double material 58. A flat lower surface or datum surface 102 is defined in the first head 88a. The datum surface 102 is designed to face the upper surface of the work stage 82, namely, the first pallet 86a. A stripe of protrusion 104 is formed to extend over the datum surface 102 along a straight line 103. The protrusion 104 is designed to swell from the datum surface 102 toward the work stage 82. Heat surfaces 105 are defined on the top of the protrusion 104. All the heat surfaces 105 are arranged within a plane. The location of the heat surfaces 105 reflects the location of the receiving surfaces 99 of the first pallet 86a. The difference in height between the heat surfaces 105 and the datum surface 102 is set at approximately 2.0 mm, for example.

Slits 106 are defined between the adjacent heat surfaces 105. The depth of the slit 106 is set smaller than the difference in height between the heat surfaces 105 and the datum surface 102, for example. Here, the depth of the slit 106 are set at approximately 200 μm from the heat surfaces 105.

Depressions 107 are defined on the datum surface 102 adjacent the protrusion 104. The depressions 107 are designed to extend along the protrusion 104 from the center to the outer sides in the longitudinal direction of the protrusion 104. The depth of the depression 107 is set deepest at the center of the longitudinal direction of the protrusion 104. The depth of the depression 107 gets shallower at the outer sides of the longitudinal direction. Here, the depth of the depression 107 is set at 4.0 mm at the center of the longitudinal direction. The depth of the depression 107 is set at 3.0 mm at the boundary between the depression 107 and the datum surface 102. Specifically, the depth of the depression 107 varies stepwise. When the first head 88a of this type is coupled to the heat source block 87 of the heating apparatus 81, a heat generating unit 108 within the heat source block 87 is aligned with the straight line 103, namely, the longitudinal direction of the protrusion 104, as is apparent from FIG. 16.

Now, assume that the first pallet 86a and the first head 88a are set in the heating apparatus 81. The first and second plate materials 41, 51 are placed on the first pallet 86a in this sequence as described above. A thermosetting adhesive is interposed between the second plate members 29b of the first attachment plates 29 in the first plate material 41 and the corresponding first electrode plates 31 in the second plate material 51. An electric power is supplied to the heat generating unit 108 within the heat source block 87 after the first head 88a has been mounted. The heat generating unit 108 heats the heat source block 87. The heat of the heat source block 87 is transferred to the first head 88a. The first head 88a is heated to the temperature of 200 degrees Celsius, for example.

Thereafter, the pressurized cylinder 84 acts to urge the first head 88a against the first pallet 86a. The heat surfaces 105 of the first head 88a is forced to hold the second plate members 29b of the first attachment plates 29 and the first electrode plates 31 against the receiving surfaces 99 of the first pallet 86a. The heat of the heat surfaces 105 is transferred to the first electrode plates 31 and the second plate members 29b of the first attachment plates 29. Rise in the temperature of the second plate members 29b and the first electrode plates 31 causes the thermosetting adhesive to get cured or hardened. The first electrode plates 31 are in this manner adhered to the corresponding first attachment plates 29.

Figure 17:
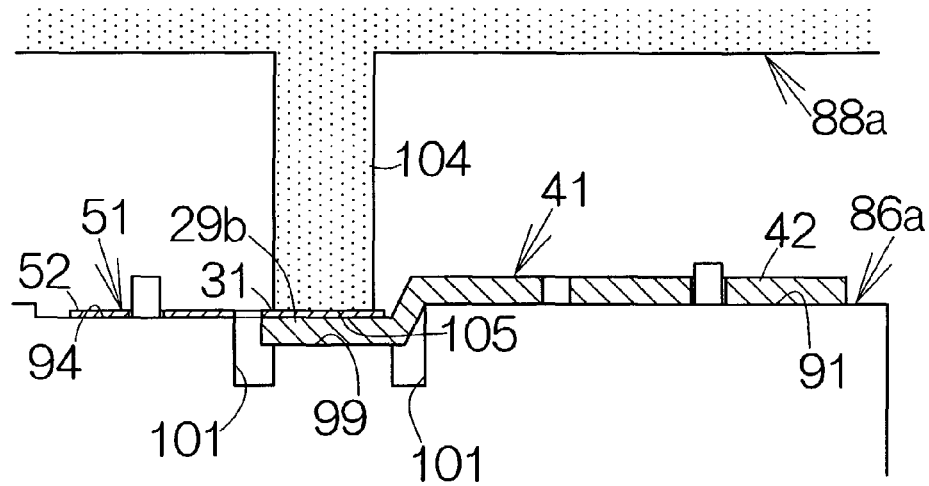
FIG. 17 is a sectional view, corresponding to FIG. 14, schematically illustrating the first attachment plate and the first electrode plate held between the first pallet and the first head.

As is apparent from FIG. 17, the heat surfaces 105 of the first head 88a contact the surfaces of the first electrode plates 31, while the first head 88a is prevented from contacting the frame plate 42 of the first plate material 41 as well as the connection plate 52 of the second plate material 51. An airspace of a thickness of 2.0 mm or larger is established between the first head 88a and the frame plate 42 as well as between the first head 88a and the connection plate 52 in the vicinity of the heat surfaces 105. The frame plate 42 and the connection plate 52 are prevented from receiving the heat from the first head 88a. In addition, the heat of the frame plate 42 and the connection plate 52 conducts to the first and second datum surfaces 91, 94 as the endoergic surfaces. A rise in the temperature of the frame plate 42 as well as of the connection plate 52 can be avoided. The frame plate 42 and the connection plate 52 are reliably prevented from thermal expansion in this manner. It is possible to reliably maintain the intervals s between the adjacent first attachment plates 29 in the first plate material 41 as well as the intervals s between the adjacent first electrode plates 31 in the second plate material 51 constant. A displacement or slippage can be prevented between the first attachment plates 29 and the corresponding first electrode plates 31. The inventors has confirmed that the airspace of a thickness of 2.0 mm or larger serves to reliably suppress enough or avoid thermal expansion of the frame plate 42 and the connection plate 52. On the other hand, if the frame plate 42 and the connection plate 52 are simultaneously subjected to heat, a remarkable displacement or slippage has been caused between the first attachment plates 29 and the first electrode plates 31 when the temperature of the head exceeds 120 degree Celsius.

Figure 18:
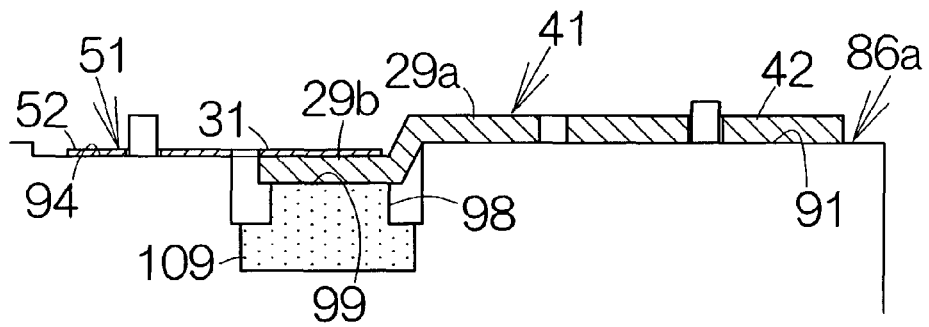
FIG. 18 is a sectional view, corresponding to FIG. 14, schematically illustrating the structure of a first pallet according to a modified example.

Moreover, the heat insulating grooves 101 of the first pallet 86a serve to define an airspace between the receiving surface 99 and the datum surfaces 91, 94 as the endoergic surfaces. The receiving surfaces 99 are thermally isolated from the datum surfaces 91, 94. Accordingly, the heat of the receiving surfaces 99 hardly conducts to the datum surfaces 91, 94. The temperature of the first attachment plates 29 and the first electrode plates 31 rises in an efficient manner. Alternatively, a heat insulating layer 109 may be embedded into the surface of the first pallet 86a so as to prevent a heat conduction between the receiving surfaces 99 and the datum surfaces 91, 94, as shown in FIG. 18, for example. In this case, the insulating layer 109 is designed to define the receiving surfaces 99 and the pedestals 98. The insulating layer 109 may be made from an alumina ceramic material such as $Al_2O_3$—TiC. A hardness of this type of material leads to less abrasion of the pedestals 98 and the receiving surfaces 99.

Figure 19:
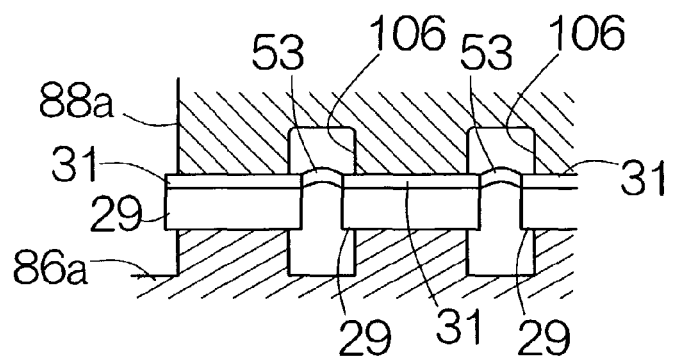
FIG. 19 is a sectional view, corresponding to an enlarged partial sectional view taken along the line 19-19 in FIG. 13, schematically illustrating the first attachment plate and the first electrode plate held between the first pallet and the first head.

Even when thermal expansion is induced in the attachment pieces 53 between the adjacent first electrode plates 31, the first head 88a allows the slits 106 to accept the bent or deformed attachment pieces 53, as shown in FIG. 19, for example. The deformation of the attachment pieces 53 serves to maintain the intervals s between the adjacent first electrode plates 31. Even if the first electrode plates 31 cannot thermally be isolated from each other enough, the first electrode plates 31 can be prevented from displacement or slippage because of the slits 106.

Figure 20:
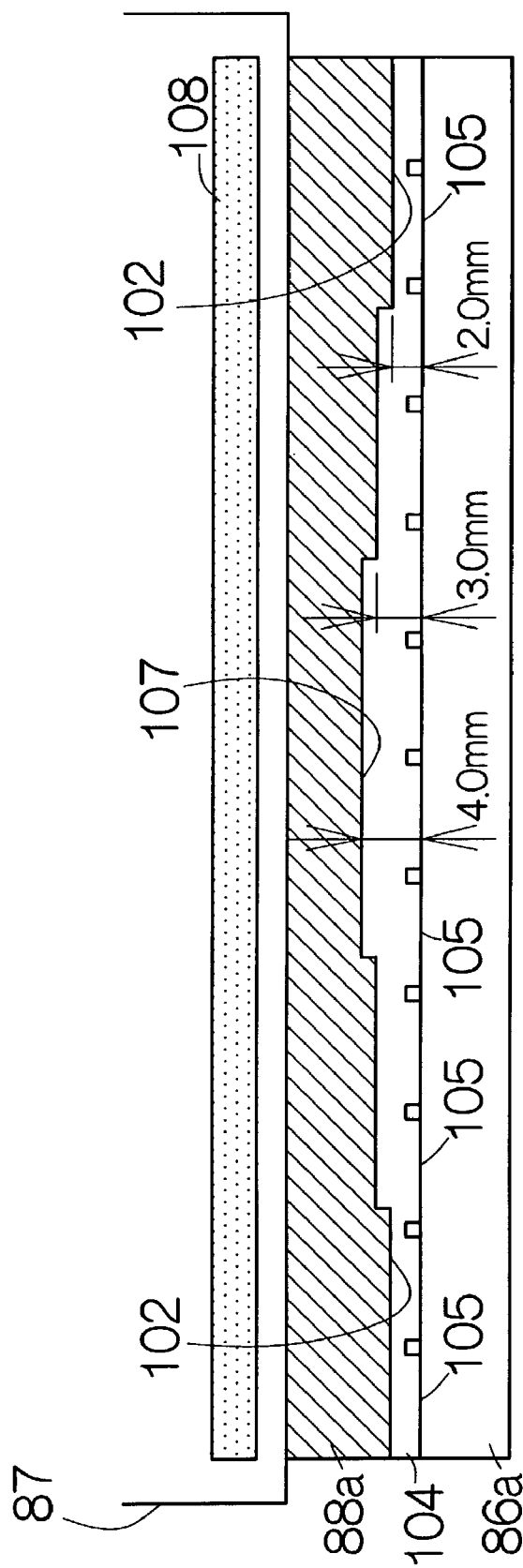
FIG. 20 is a sectional view, corresponding to an enlarged partial sectional view taken along the line 20-20 in FIG. 16, illustrating the space between the first pallet and a datum surface as well as a depression in the first head.

As shown in FIG. 20, the thickness of the airspace adjacent the protrusion 104 gets increased at the central area in the longitudinal direction of the protrusion 104 in the first head 88a. The lower surface of the first head 88a is located nearer to the first pallet 86a at the outer sides of the longitudinal direction as compared with the central area of the longitudinal direction. A heat radiation can be suppressed from the protrusion 104 around the heat surfaces 105 near the outer sides as compared with the central area of the longitudinal direction. It is thus possible to establish a constant temperature at the respective heat surfaces 105 with the single heat generating unit 108 located in parallel with the protrusion 104. The heat surfaces 105 are allowed to provide the same level or intensity of heat energy. On the other hand, if the datum surface 102 extends constantly adjacent the protrusion 104 over the entire longitudinal direction of the protrusion 104, heat tends to efficiently radiate from the protrusion 104 near the outer sides of the longitudinal direction. Difference in temperature is induced between the heat surfaces 105 near the outer sides and the heat surfaces 105 near the center in the longitudinal direction of the protrusion 104.

As is apparent from FIG. 21, the periphery of the individual heat surface 105 is set smaller than the contour of the corresponding first electrode plate 31 in the aforementioned heating apparatus 81. Specifically, when the heat surface 105 is urged against the first electrode plate 31, the first electrode plate 31 constantly protrudes outward from the periphery of the heat surface 105. The size of the heat surface 105 may be set enough to raise the temperature of the second plate member 29b of the first attachment plate 29 that is interposed between the heat surface 105 and the receiving surface 99. Here, the space or distance between the contours of the heat surface 105 and of the first electrode plate 31 is set in a range between 100 μm and 200 μm, for example.

Employment of the receiving surface 99 and the heat surface 105 of smaller sizes in the aforementioned manner serves to prevent the first pallet 86a and the first head 88a from receiving an adhesive 111 overspilling from the space between the first attachment plate 29 and the first electrode plate 31, as shown in FIG. 22. The capillary action cannot bring the adhesive 111 into contact with the first pallet 86a and the first head 88a in this case. The first pallet 86a and the first head 88a are maintained clean. On the other hand, if a receiving surface is set larger than the first attachment plate 29 while a heat surface is set larger than the first electrode plate 31, the overspilling adhesive tends to contact or adhere to the receiving surface and the heat surface with the assistance of the capillary action.

The unique types of the pallets 86 and the heads 88 are required for preparation of the second double material 78 and the adhesion between the first and second double materials 58, 78 in the same manner as described above. The pallets 86 may define endoergic surfaces receiving the frame and connection plates 42, 62, 72 in the individual plate materials 41, 61, 71 as well as receiving surfaces for receiving the first and second attachment plates 29, 39 and the second electrode plates 37 included in the individual plate materials 41, 61, 71. The heads 88 may define protrusions swelling from the surface of the head 88 as well as heat surfaces individually contacting the second electrode plates 37 and the second attachment plates 39. In any event, it is possible to reliably keep the intervals s between the adjacent first attachment plates 29, between the adjacent second electrode plates 37 and between the adjacent second attachment plates 39 in the respective plate materials 41, 61, 71 constant.

What is claimed is:

1. A heating apparatus comprising:
   a work stage receiving a work;
   a heat block opposed to the work stage;
   at least a stripe of protrusion swelling from a surface of the heat block toward the work stage;
   a heat surface, for contacting the work, defined on a surface of the protrusion that faces the work stage; and
   a depression located on the surface of the heat block adjacent the protrusion and extending from a center to an outer side in a longitudinal direction of the protrusion, the depression having a depth that varies such that the surface of the heat block gets nearer to the work stage at the outer side in the longitudinal direction as compared with the center in the longitudinal direction in the depression.

2. A heating apparatus comprising:
   a work stage receiving a work;
   a heat block opposed to the work stage;
   a heat surface defined on the heat block for contacting the work on the work stage;
   a receiving surface defined on a surface of the work stage and opposed to the heat surface; and
   an endoergic surface defined on the work stage spaced from the receiving surface, said endoergic surface contacting with the work, wherein said endoergic surface has a higher thermal conductivity than said receiving surface and further wherein said endoergic surfaces serves to transmit heat from the work to the work stage.

3. The heating apparatus according to claim 2, wherein said work stage comprises a base set on a predetermined datum plane, and a pallet detachably mounted on the base and defining the receiving surface and the endoergic surface.

4. The heating apparatus according to claim 3, wherein at least a stripe of protrusion is formed on the heat block so as to swell from a surface of the heat block toward the work stage, the heat surface being formed on a top surface of the protrusion.

5. A heating apparatus comprising:
   a work stage receiving a work;
   a heat block opposed to the work stage;
   a heat surface defined on the heat block for contacting the work on the work stage; and
   an insulating layer formed on a surface of the work stage and opposed to the heat surface of the heat block, said insulating layer being made from an alumina ceramic material.

6. The heating apparatus according to claim 5, wherein said work stage comprises a base set on a predetermined datum plane, and a pallet detachably mounted on the base for receiving the work.

7. The heating apparatus according to claim 6, wherein at least a stripe of protrusion is formed on the heat block so as to swell from a surface of the heat block toward the work stage, the heat surface being formed on a top surface of the protrusion.

8. A heating apparatus comprising:
   a work stage receiving a work;
   a heat block opposed to the work stage;
   a heat surface defined on the heat block for contacting the work on the work stage;
   a receiving surface defined on a surface of the work stage and opposed to the heat surface; and
   a groove formed on the surface of the work stage adjacent the receiving surface, said groove serving to space said receiving surface from other portions of the work stage.

9. The heating apparatus according to claim 8, wherein said work stage comprises a base set on a predetermined datum plane, and a pallet detachably mounted on the base for defining the receiving surface and the groove.

10. The heating apparatus according to claim 9, wherein at least a stripe of protrusion is formed on the heat block so as to swell from a surface of the heat block toward the work stage, the heat surface being formed on a top surface of the protrusion.

11. A heating apparatus comprising:
    a base set on a predetermined datum plane;
    a pallet detachably mounted on the base for receiving a work;
    a heat block opposed to a surface of the pallet; and
    a heat surface defined on the heat block for contacting the work on the pallet, wherein said pallet includes:
      a receiving surface defined on the surface of the pallet and opposed to the heat surface; and
      a groove formed on the surface of the pallet adjacent the receiving surface, said groove serving to space said receiving surface from other portions of the pallet.

12. The heating apparatus according to claim 11, wherein at least a stripe of protrusion is formed on the heat block so as to swell from a surface of the heat block toward the work stage, the heat surface being formed on a top surface of the protrusion.

13. The heating apparatus according to claim 12, wherein the surface of the pallet is provided with a receiving surface opposed to the heat surface of the heat block, and an endoergic surface adjacent the receiving surface.

14. The heating apparatus according to claim 13, wherein the receiving surface includes a surface of an insulating material embedded into the surface of the pallet.

* * * * *